US006789146B1

(12) United States Patent
Dlugosch (10) Patent No.: US 6,789,146 B1
(45) Date of Patent: Sep. 7, 2004

(54) SOCKET FOR RECEIVING A SINGLE-CHIP VIDEO CONTROLLER AND CIRCUIT BOARD CONTAINING THE SAME

(75) Inventor: Paul Dlugosch, Eagle, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/022,544

(22) Filed: Feb. 12, 1998

(51) Int. Cl.$^7$ ............................. G06F 13/00; H05K 1/18
(52) U.S. Cl. ..................... 710/100; 361/764; 257/691
(58) Field of Search ......................... 710/100; 361/760, 361/761, 764, 767, 784–791; 257/691

(56) References Cited

U.S. PATENT DOCUMENTS

| | | | | |
|---|---|---|---|---|
| 4,503,429 A | * | 3/1985 | Schreiber | 345/190 |
| 4,818,240 A | * | 4/1989 | Karner | 439/64 |
| 4,832,610 A | * | 5/1989 | Matsuoka | 439/68 |
| 5,287,617 A | * | 2/1994 | Murphy | 29/741 |
| 5,325,490 A | | 6/1994 | Brasseur | 710/129 |
| 5,485,351 A | * | 1/1996 | Hopfer et al. | 361/704 |
| 5,523,773 A | * | 6/1996 | Arakawa et al. | 345/98 |
| 5,581,279 A | * | 12/1996 | Chang et al. | 345/190 |
| 5,600,540 A | | 2/1997 | Blomquist | 361/704 |
| 5,643,000 A | | 7/1997 | Dent | |
| 5,671,118 A | | 9/1997 | Blomquist | 361/704 |
| 5,675,772 A | | 10/1997 | Liu et al. | 395/500 |
| 5,694,143 A | * | 12/1997 | Fielder et al. | 345/112 |
| 5,712,664 A | * | 1/1998 | Reddy | 345/516 |
| 5,751,295 A | * | 5/1998 | Becklund et al. | 345/501 |
| 5,791,928 A | * | 8/1998 | Lai | 439/342 |
| 5,870,621 A | * | 2/1999 | Walsh et al. | 712/32 |
| 5,896,140 A | * | 4/1999 | O'Sullivan | 345/508 |
| 5,900,887 A | * | 5/1999 | Leung et al. | 345/521 |
| 5,963,192 A | * | 10/1999 | Wong et al. | 345/150 |
| 5,973,924 A | * | 10/1999 | Gillespie, Jr. | 361/735 |
| 6,000,048 A | * | 12/1999 | Krishna et al. | 714/718 |
| 6,012,929 A | * | 1/2000 | Matsumura | 439/70 |
| 6,041,010 A | * | 3/2000 | Puar et al. | 365/226 |
| 6,141,021 A | * | 10/2000 | Bickford et al. | 345/503 |
| 6,288,418 B1 | * | 9/2001 | Reed et al. | 257/209 |
| 6,301,104 B1 | * | 10/2001 | Hu | 361/684 |

FOREIGN PATENT DOCUMENTS

| | | |
|---|---|---|
| EP | 0 809 230 A | 11/1997 |
| WO | WO 97/19405 | 5/1997 |

OTHER PUBLICATIONS

ATI, Rage XI Product Snapshot, 2003, ATI.*
Taketani et al., Development of MF–BGA (Mounting Frame BGA), 1998, SMI '98, 2nd Annual Chip Scale Packaging (CSP) Symposium, pp. 1–5.*
Sony, Integrated Circuit Packages, 2000, Sony Semiconductor IC Packages Guide, pp. 1–15.*
Ghaffarian, Technology Readiness Overview: Ball Grid Array and Chip Scale Packaging, Jan. 2003, NASA, pp. 1–12.*
Bertuch, M. "Pixel–Highway," CT Magazin Fuer Computer Technik, No. 4, Apr. 1997, pp. 260–262.
Accelerated Graphics Port Interface Specification; Jul. 31, 1996.
PC 98 Design Issues; Intel Corporation and Microsoft Corporation, 1997.
Proposal (VESA) Video Interface Port (VIP); Revision Date: Oct. 2, 1997; p. 1–50.
Part Details for P/N: 916756–1; p. 1–2.

* cited by examiner

Primary Examiner—Sumati Lefkowitz
(74) Attorney, Agent, or Firm—Dickstein Shapiro Morin & Oshinsky LLP (57) ABSTRACT

A circuit board socket is provided which is adapted to accept a plug-in single video controller having embedded video memory. The socket allows a circuit board to be easily wired to accommodate different, replaceable embedded memory video controller chips. The socket allows power to be separately supplied from the circuit board via terminals to various portions, including an embedded video memory, of the single-chip video controller. The socket is preferably compliant with AGP and VIP standards.

56 Claims, 4 Drawing Sheets

SOCKET FOR RECEIVING A SINGLE-CHIP VIDEO CONTROLLER AND CIRCUIT BOARD CONTAINING THE SAME

BACKGROUND OF THE INVENTION

The present invention relates to a structure for mounting a video controller on a processor circuit board, sometimes called a "motherboard" for use in computers, such as personal computers and network workstations. In particular, the invention is directed to a socket adapted to receive a plug-in single-chip video controller, and to a circuit board and computer system containing the socket.

DESCRIPTION OF THE RELATED ART

Currently video controllers for use in small computers, such as personal computers and network computers, are connected to a processor motherboard in one of two ways. One is by hard wiring a plurality of video controller integrated circuits ("chips") and associated video memory directly onto a computer motherboard, and the other is by plugging in a card containing the video controller circuitry and associated memory into a card socket provided on the motherboard.

Currently many, if not most, video controller chip sets directly wired to the motherboard, or video controller cards which plug into a socket on the motherboard, comply with the Intel AGP/PCI interface standard called the Accelerated Graphics Port Interface Specification (Version 1.0, published by Intel, Jul. 31, 1996). This is a high speed specification for a video bus designed to improve video data throughput through a computer system and permits access of the video controller to main system memory for certain video operations.

When a video controller chip set is directly wired onto the motherboard, the motherboard manufacturer chooses the chip set based on its own design criteria which may or may not reflect the needs of the ultimate computer user. Although this provides a relatively low cost video controller implementation, the video controller design is fixed and inflexible. Accordingly, if a user wishes to change, e.g. upgrade, the video controller, it is impossible to do so without changing the motherboard or adding a separate plug-in video controller board to an available PCI bus socket. Replacing the motherboard is both costly and time consuming, and is typically only done by a trained professional. Adding a new video controller board is also costly and, additionally, the PCI bus structure is relatively slow considering today's video graphics requirements.

In addition, a wired-in video controller chip set also requires additional land patterns on the motherboard to accommodate the several chips which implement the video controller as well as the associated video memory, and to provide additional memory land areas for possible expansion of the video memory.

The plug-in video controller board has advantages over the wired-in chip sets, since the user can easily replace one video controller board, which includes the video chip set and associated video memory, with another. While this allows for ease of modification of the video controller circuitry without requiring replacement of the motherboard, the plug-in video controller board itself is expensive and further it occupies one of the computer system's accessory sockets which may limit or hamper the ability of the user to plug in other desired circuit cards. Indeed, for those motherboards which accept a plug-in video controller card which is AGP/PCI compliant, a special socket is required just for the video controller board.

SUMMARY OF THE INVENTION

The present invention is designed to remedy problems associated with both the wired-in video controller chip set and the plug-in video controller boards. It provides a socket for a motherboard which is adapted to receive a single chip integrated circuit video controller which has embedded video memory and which provides all of the video controller functions currently supplied by existing video controller chip sets or plug-in video card controllers and associated video memory. Preferably the socket and its associated plug-in video controller chip are AGP/PCI compliant.

Providing a socket for receiving a single-chip plug-in video controller on the motherboard allows an OEM computer system manufacturer and/or vendor to easily adapt the computer system to the video requirements of a user by simply choosing the plug-in chip which best fits the user's requirements. The invention also provides a reduced system cost compared to add-in card video controller implementations and provides for a simplified assembly and testing of a computer system. Likewise, a vendor or user can easily replace one plug-in video controller chip with another for upgrading or if the user's video requirements otherwise change. This also allows for easy and relatively inexpensive upgradability of the video controller without requiring replacement of a motherboard or a whole card of expensive components. Furthermore, using a single chip video controller permits the computer system to obtain a higher speed video performance with reduced power consumption because of the embedded memory within the video controller chip.

Accordingly, the invention provides a plug-in single chip video controller socket for use on a motherboard and a motherboard and computer system containing the socket. The socket is wired on the motherboard and is electrically connected with the other board components which make up a computer system, including a microprocessor, main memory circuits, input/output ports etc. The socket has receiving terminals for the pins of the video controller chip and electrical solder terminals for connecting the pins of the video controller chip with the other circuits on the motherboard. The socket also provides connections between the video controller chip and video input and output terminals also provided on the motherboard. A computer system circuit board is thus provided which allows for an easy choice of video controllers to be used with the computer system, while at the same time freeing up board real estate normally reserved for the video chip sets and associated video memory and/or for a socket for a plug-in video controller card.

Preferably, the socket and motherboard containing it are compliant with Intel AGP/PCI specifications as well as the VESA VIP specifications for video input.

These and other advantages and features of the invention will be more readily understood from the following detailed description of the invention, which is provided in connection with the accompanying drawings.

DETAILED DESCRIPTION OF THE INVENTION

Figure 1:
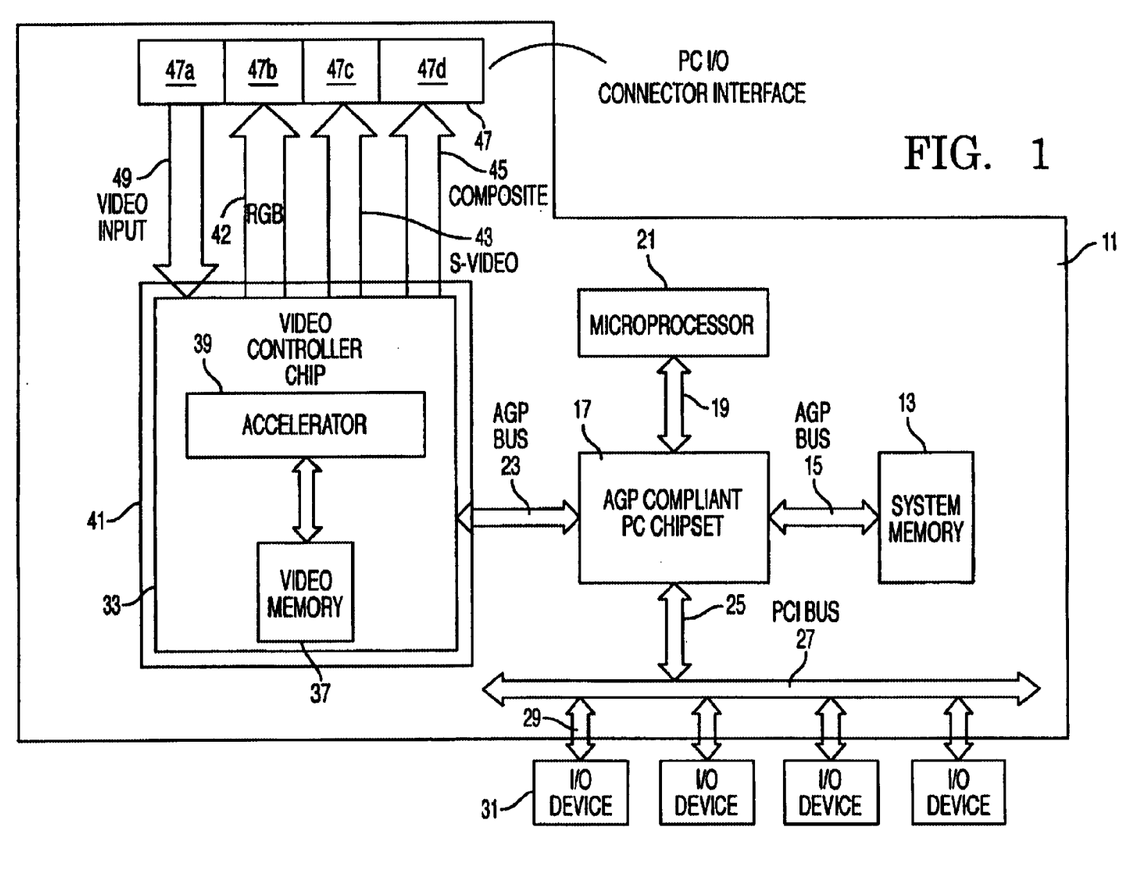
FIG. 1 illustrates, in block diagram form, a circuit board containing a socket provided in accordance with the invention.

Referring to FIG. 1, a circuit board 11 is shown having computer system components mounted thereon which are depicted in block diagram format. The computer system is designed to be compliant with the Accelerated Graphics Port Specification, revision 1.0 by Intel Corporation, published Jul. 31, 1996, which is incorporated herein by reference. The computer system includes a system main memory 13, a portion 15 of an accelerated graphic port (AGP) bus, an accelerated graphics port compliant chip set 17 (such as Intel 440LX or equivalent), a bus 19 interconnecting the chip set 17 with a microprocessor 21 which, may for example, be an Intel Pentium II microprocessor, another portion 23 of the accelerated graphics bus, and a conventional PCI bus 27 which interconnects the AGP compliant chip'set with input/output ports 31 for the other devices, e.g. key board, hard drive, floppy drive, CD-ROM drive, mouse, etc. through additional bus structures 25 and 29.

Figure 2A:
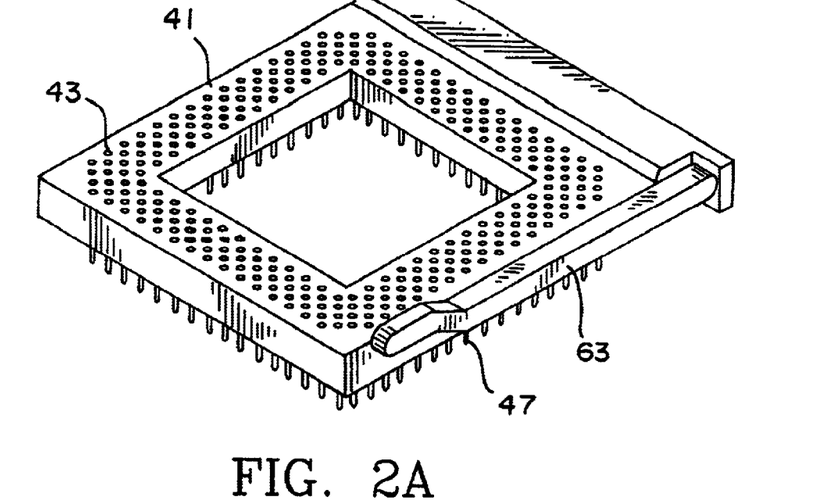
FIGS. 2A, 2B, and 2C respectively show perspective, top and side views of the socket used on the FIG. 1 circuit board; and, FIG. 3 illustrates the connection of the socket of the invention with VESA VIP compliant modules and add-in boards.
Figure 2B:
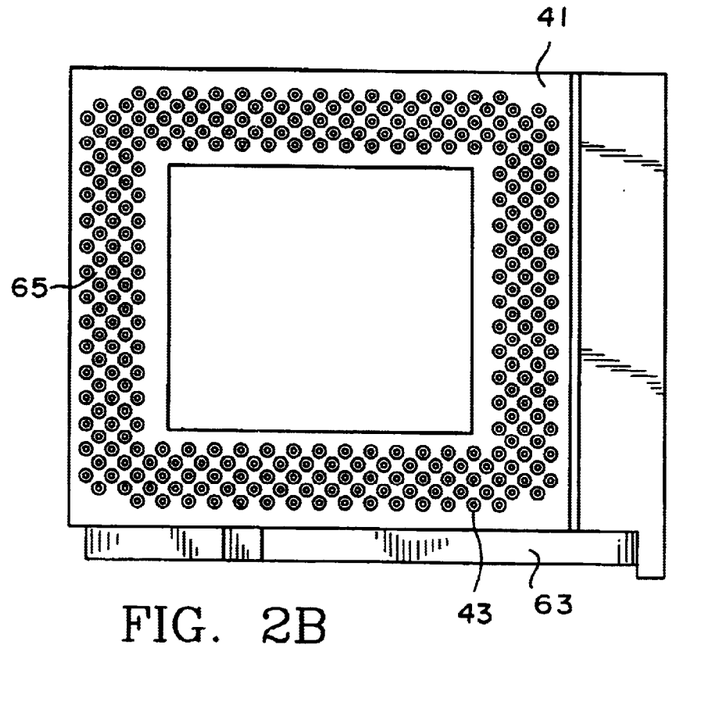
Figure 2C:
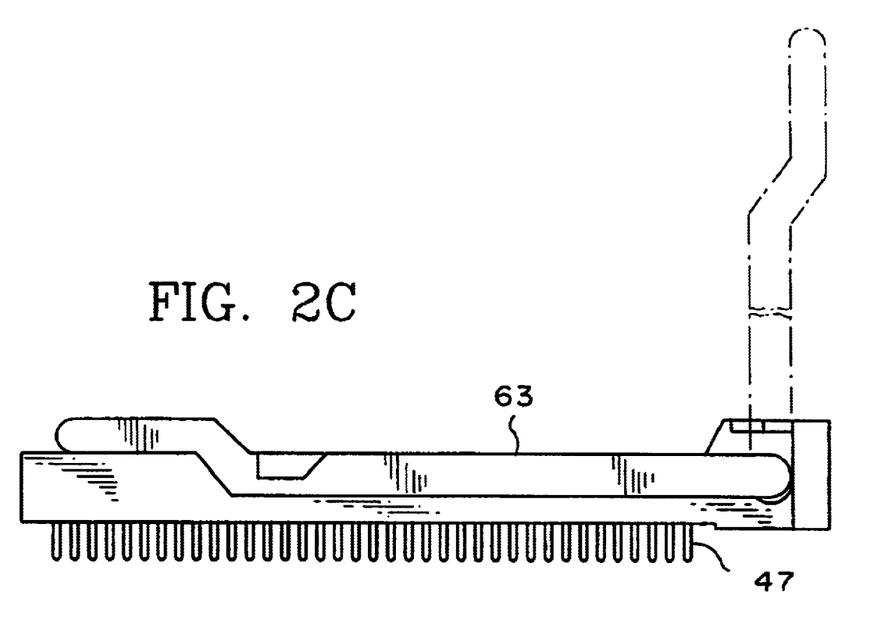

The AGP compliant chip set 17 is connected via the portion 23 of the AGP bus with a single-chip video controller 33 which is mounted to board 11 by a socket 41, shown in greater detail in FIGS. 2A, 2B and 2C. The single chip video controller 33 performs all the functions currently performed by an AGP/PCI compliant video chip set or plug-in controller board in accordance with the AGP/PCI interface specification described above. For example, the video controller chip 33 performs all the functions of, and has connection pins which correspond to, the connection terminals of the commercially available Number Nine Visual Technology plug-in video controller board known as the Revolution 3D, the Matrox plug-in video controller board known as the Millennium II or the Diamond Stealth II S220 or the Matrox Mystique 200 boards. Alternatively, video controller chip 33 performs all the functions of, and has connection pins which correspond to the connection terminals of the commercially available chip sets known as Cirrus Logics CL-6D5465A.C.P. or ATI's 3D Page Pro, plus associated video memory.

The video processor 33 includes video memory 37 and a video accelerator 39. Video memory 37 and accelerator 39 are all integrated on a single plug-in IC chip 33 which connects to the remaining circuitry on board 11 through socket 41.

The chip 33 transmits and receives, through socket 41, all of the AGP/PCI signals normally transmitted and received by a AGP/PCI compliant plug-in video controller card, as required by the AGP/PCI specification. Video controller chip 33 also produces display signals in the form of an RGB signal 42, an S-video signal 43 and a composite video signal 45 which are supplied to respective pins of connectors 47b, 47c, and 47d provided on board 11. The S-video and composite video signals are preferably NTSC or PAL compatible. An input/output connector 47a is also provided on board 11 for supplying analog and/or digital video input signals 49 to video controller chip 33. The input/output connectors 47a . . . 47d are designed to connect various external display monitors and/or television sets to the board 11 computer system and to receive input from an analog or digital video source which is supplied by a bus 49 as an input to the video controller chip 33.

As noted, the video controller chip 33 is mounted to the circuit board 11 via a socket 41 which is illustrated in greater detail in FIGS. 2A, 2B and 2C. Socket 41 is a zero insertion force (ZIF) socket and is similar in design and operation to a so-called "socket 7", which is currently used to mount plug-in microprocessor chips, such as the Intel Pentium, to a circuit board. Socket 41 has a chip release mechanism, such as the illustrated manually manipulated lever 63, for allowing the quick and easy release of video controller chip 33 from socket 41. Although a manually manipulated lever 63 is illustrated in the drawings, any other mechanism which permits easy release of controller chip 33 from socket 41 can be used. Socket 41 also includes a terminal pattern 65 which provides a keying structure which insures that only a plug-in chip video controller 33, which has the correct complementary pin key structure and which is properly arranged on socket 41 can be inserted therein.

Socket 41 includes receiving terminals 43 for receiving the pins of the plug-in video controller chip 33 and corresponding solder tail terminals 47 which are wired onto circuit board 11. The terminals 43 and 47 are sufficient in number to carry all the signals necessary for a plug-in video controller chip 33 which is compliant with the AGP/PCI interface specification.

Table I below illustrates a terminal signal configuration for socket 41 which is fully AGP/PCI compliant.

TABLE I

| Socket Signal Listing | |
|---|---|
| Type | Signal Name |
| AGP | +12 V |
| AGP | Spare |
| AGP | Reserved |
| AGP | USB– |
| AGP | GND |
| AGP | INTA# |
| AGP | RST# |
| AGP | GNT# |
| AGP | VCC3.3 |
| AGP | ST1 |
| AGP | Reserved |
| AGP | PIPE# |
| AGP | GND |
| AGP | Spare |
| AGP | SBA1 |
| AGP | VCC3.3 |
| AGP | SBA3 |
| AGP | Reserved |
| AGP | GND |
| AGP | SBA5 |
| AGP | SBA7 |
| AGP | Key |
| AGP | Key |
| AGP | Key |
| AGP | Key |
| AGP | AD30 |
| AGP | AD28 |
| AGP | VCC3.3 |
| AGP | AD26 |
| AGP | AD24 |
| AGP | GND |
| AGP | Reserved |
| AGP | C/BE3# |
| RGB | Red |
| RGB | Green or Green + Sync |
| RGB | Blue |
| RGB | Ground - Red |
| RGB | Ground - Green |
| RGB | Ground - Blue |
| RGB | Ground - Sync |
| RGB | V. Sync or not used |
| RGB | H. Sync or not used |
| RGB | DDC data (SDA) |
| VIP | VID0 |

TABLE I-continued

Socket Signal Listing

| Type | Signal Name |
|---|---|
| VIP | VID1 |
| RGB | Data Clock |
| Power | AVDD0 |
| Power | AVDD1 |
| Power | VDDQ0 |
| Power | GNDL0 |
| Power | GNDL4 |
| Power | GNDL8 |
| Power | VDDDQ0 |
| Power | VDDDQ1 |
| Power | VDDDQ2 |
| Power | VDDDQ2 |
| Power | VDDDQ3 |
| Power | VDDDQ4 |
| Power | VDDDQ5 |
| Power | VDDDQ6 |
| Power | VDDDQ7 |
| Power | VDDDQ8 |
| Power | VDDDQ9 |
| Power | VDDDQ10 |
| Power | VDDDQ11 |
| Power | VDDDQ12 |
| Power | VDDDQ13 |
| Power | VDDDQ14 |
| Power | VDDDQ15 |
| Socket X | Reserved |
| Socket X | Reserved |
| Socket X | Reserved |
| Socket X | Reserved |
| AGP | OVRCNT# |
| AGP | 5.0V |
| AGP | 5.0V |
| AGP | USB+ |
| AGP | GND |
| AGP | INTB# |
| AGP | CLK |
| AGP | REQ# |
| AGP | VCC3.3 |
| AGP | ST0 |
| AGP | ST2 |
| AGP | RBF# |
| AGP | GND |
| AGP | Spare |
| AGP | SBA0 |
| AGP | VCC3.3 |
| AGP | SBA2 |
| AGP | SB_STB |
| AGP | GND |
| AGP | SBA4 |
| AGP | SBA6 |
| AGP | Key |
| AGP | Key |
| AGP | Key |
| AGP | Key |
| AGP | AD31 |
| AGP | AD29 |
| AGP | VCC3.3 |
| AGP | AD27 |
| AGP | AD25 |
| AGP | GND |
| AGP | AD_STB1 |
| AGP | AD23 |
| Comp | Composite Signal |
| Comp | Composite Ground |
| S-Video | Ground Luminance |
| S-Video | Ground - Chrominance |
| S-Video | Y - Luminance |
| S-Video | C - Chrominance |
| VIP | VIPOCLK |
| VIP | HAD0 |
| VIP | HAD1 |
| VIP | HCTL |
| VIP | VID2 |
| VIP | VID3 |
| VIP | PIXCLK |
| VIP | VRST# |
| VIP | VIRQ# |
| Power | VDDQ1 |
| Power | GNDL1 |
| Power | GNDL5 |
| Power | GNDL9 |
| Power | VDDDQ16 |
| Power | VDDDQ17 |
| Power | VDDDQ18 |
| Power | VDDDQ18 |
| Power | VDDDQ19 |
| Power | VDDDQ20 |
| Power | VDDDQ21 |
| Power | VDDDQ22 |
| Power | VDDDQ23 |
| Power | VDDDQ24 |
| Power | VDDDQ25 |
| Power | VDDDQ26 |
| Power | VDDDQ27 |
| Power | VDDDQ28 |
| Power | VDDDQ29 |
| Power | VDDDQ30 |
| Power | VDDDQ31 |
| Socket X | Reserved |
| Socket X | Reserved |
| Socket X | Reserved |
| Socket X | Reserved |
| AGP | Vddq3.3 |
| AGP | AD22 |
| AGP | AD20 |
| AGP | GND |
| AGP | AD18 |
| AGP | AD16 |
| AGP | Vddq3.3 |
| AGP | FRAME# |
| AGP | Reserved |
| AGP | GND |
| AGP | Reserved |
| AGP | VCC3.3 |
| AGP | TRDY# |
| AGP | STOP# |
| AGP | PME# |
| AGP | GND |
| AGP | PAR |
| AGP | AD16 |
| AGP | Vddq3.3 |
| AGP | AD13 |
| AGP | AD11 |
| AGP | GND |
| AGP | AD9 |
| AGP | C/BE0# |
| AGP | Vddq3.3 |
| AGP | Reserved |
| AGP | AD6 |
| AGP | GND |
| AGP | AD4 |
| AGP | AD2 |
| AGP | Vddq3.3 |
| AGP | AD0 |
| AGP | Reserved |
| Power | VDDL0 |
| Power | VDDL1 |
| Power | VDDL2 |
| Power | VDDL3 |
| Power | VDDL4 |
| Power | VDDL5 |
| Power | VDDL6 |
| Power | VDDL7 |
| Power | VDDD0 |
| Power | VD 0 |
| VIP | V1.4 |
| VIP | VIDV |
| Power | VDDD2 |
| Power | VDDD3 |
| Power | GNDD2 |

TABLE I-continued

Socket Signal Listing

| Type | Signal Name |
| --- | --- |
| Power | VDDQ2 |
| Power | GNDL2 |
| Power | GNDL6 |
| Power | PVDD |
| Power | GNDDQ0 |
| Power | GNDDQ1 |
| Power | GNDDQ2 |
| Power | GNDDQ3 |
| Power | GNDDQ4 |
| Power | GNDDQ5 |
| Power | GNDDQ6 |
| Power | GNDDQ7 |
| Power | GNDDQ8 |
| Power | GNDDQ9 |
| Power | GNDDQ10 |
| Power | GNDDQ11 |
| Power | GNDDQ12 |
| Power | GNDDQ13 |
| Power | GNDDQ14 |
| Power | GNDDQ15 |
| Socket X | Reserved |
| Socket X | Reserved |
| Socket X | Reserved |
| Socket X | Reserved |
| AGP | Vddq3.3 |
| AGP | AD21 |
| AGP | AD19 |
| AGP | GND |
| AGP | AD17 |
| AGP | C/BE2# |
| AGP | Vddq3.3 |
| AGP | IRDY# |
| AGP | Reserved |
| AGP | GND |
| AGP | Reserved |
| AGP | VCC3.3 |
| AGP | DEVSEL# |
| AGP | Vddq3.3 |
| AGP | PERR# |
| AGP | GND |
| AGP | SERR# |
| AGP | C/BE1# |
| AGP | Vddq3.3 |
| AGP | AD14 |
| AGP | AD12 |
| AGP | GND |
| AGP | AD10 |
| AGP | AD6 |
| AGP | Vddq3.3 |
| AGP | AD_STB0 |
| AGP | AD7 |
| AGP | GND |
| AGP | AD5 |
| AGP | AD3 |
| AGP | Vddq3.3 |
| AGP | AD1 |
| AGP | Reserved |
| Power | GNDL0 |
| Power | GNDL1 |
| Power | GNDL2 |
| Power | GNDL3 |
| Power | GNDL4 |
| Power | GNDL5 |
| Power | GNDL6 |
| Power | GNDL7 |
| Power | GNDL8 |
| Power | GNDL9 |
| VIP | VID6 |
| VIP | VID7 |
| Power | GNDD0 |
| Power | GNDD1 |
| Power | GNDD3 |
| Power | VDDQ3 |
| Power | GNDL3 |
| Power | GNDL7 |
| Power | PGND |
| Power | GNDDQ16 |
| Power | GNDDQ17 |
| Power | GNDDQ18 |
| Power | GNDDQ18 |
| Power | GNDDQ19 |
| Power | GNDDQ20 |
| Power | GNDDQ21 |
| Power | GNDDQ22 |
| Power | GNDDQ23 |
| Power | GNDDQ24 |
| Power | GNDDQ25 |
| Power | GNDDQ26 |
| Power | GNDDQ27 |
| Power | GNDDQ28 |
| Power | GNDDQ29 |
| Power | GNDDQ30 |
| Power | GNDDQ31 |
| Socket X | Reserved |
| Socket X | Reserved |
| Socket X | Reserved |
| Socket X | Reserved |

As noted, the control chip 33 includes embedded video memory 37. Accordingly, it is normally not necessary for the video accelerator circuitry 39 of the video controller chip 33 to access system main memory when performing video display operations; however, the AGP/PCI specification does recognize that the video controller may access and use such memory for certain operations. Since the video controller circuitry, including video memory, is entirely incorporated into a single video controller chip 33, the video circuitry can easily be replaced, as needed, by simply being removed from the associated socket 41. Video memory can be easily increased by replacement of the video controller chip 33 with one having more embedded memory.

It should be noted that video input 49 to chip 33 is not part of the AGP/PCI interface specification. However, video controller chip 33 and associated socket 41 have terminals for receiving a video input. This video input may be an analog or digital video input, but is preferably a video input which is compliant with proposed VESA standard for the video interface port (VIP). The VESA VIP specification version 1P, draft 3, of Oct. 2, 1997, is the current working draft and this document in incorporated herein by reference. The VIP video input signals are in digital format. As Table 1 illustrates above, socket 41, according to the invention, provides receiving terminals identified as Type AGP which are signals to and from the computer system which are currently required of an AGP compliant video board. In addition, Table 1 shows pin designations for the RGB, composite video, and S-video output signals. For ease of identifying and showing these terminals, Table II below shows the terminals for the RGB, S-video and Composite signals.

TABLE II

| Pin | Signal Name |
| --- | --- |
| RGB | Red |
| RGB | Green or Green + Sync |
| RGB | Blue |
| RGB | Ground - Red |
| RGB | Ground - Green |

TABLE II-continued

| Pin | Signal Name |
|---|---|
| RGB | Ground - Blue |
| RGB | Ground - Sync |
| RGB | H. Sync or not used |
| RGB | V. Sync or not used |
| Composite | Composite Signal |
| Composite | Composite Ground |
| S-Video | Ground - Luminence |
| S-Video | Ground - Chrominance |
| S-Video | Luminence |
| S-Video | Chrominence |
| DDC | Data Clock |
| DDC | DDC data (SDA) |

Also shown in Table I are pin designations for the VIP video input signals. The VIP signals are also shown in Table III below.

TABLE III

| Signal | Description | Location |
|---|---|---|
| VIPOCLK | VIP Host Clock (25–33 MHz) | Host Port |
| HAD[1:0] | Host Address/Data Bus | Host Port |
| HCTL | Host Control | Host Port |
| VID[7:0] | ITU-R-656 Video Data | Video Port |
| PIXCLK | ITU-R-656 Pixel Clock | Video Port |
| VRST# | VIP Module Reset | System Signal |
| VIRQ# | Interrupt Request | System Signal |

The power supply terminals of socket 41 include terminals necessary for supplying power to the various circuit portions of video controller chip 33, including for digital logic, pixel clock synthesizer, embedded DRAM memory, DRAM (input/output) I/O logic, digital to analog converter, AGP I/O digital logic etc. These power supply terminals are more easily seen from TABLE IV below.

TABLE IV

| Signal | Description |
|---|---|
| VDDL[8:1] | Digital Logic Power |
| VDDD[4:1] | DRAM Power |
| VDDDQ[32:1] | DRAM I/O Power |
| AVDD[2:1] | DAC Power |
| VDDQ[4:1] | AGP Digital I/O Power |
| PVDD | Pixel Clock Synthesizer |
| PGND | Pixel Clock Synthesizer Ground |
| GNDL[10:1] | Digital Logic Ground |
| GNDD[1:4] | DRAM Ground |
| GNDDQ[32:1] | DRAM I/O Ground |

As also illustrated in Table I, various terminals of socket 41 are reserved for future features which may be incorporated into subsequent generations of the video controller chip 33. In total, socket 41 includes 292 receiving terminals 43 and corresponding solder tail terminals 47 and is configured with 73 receiving terminals 43 (and corresponding solder tail terminal 47) on each of the four sides of its generally square configuration as shown in FIG. 2B.

Figure 3:
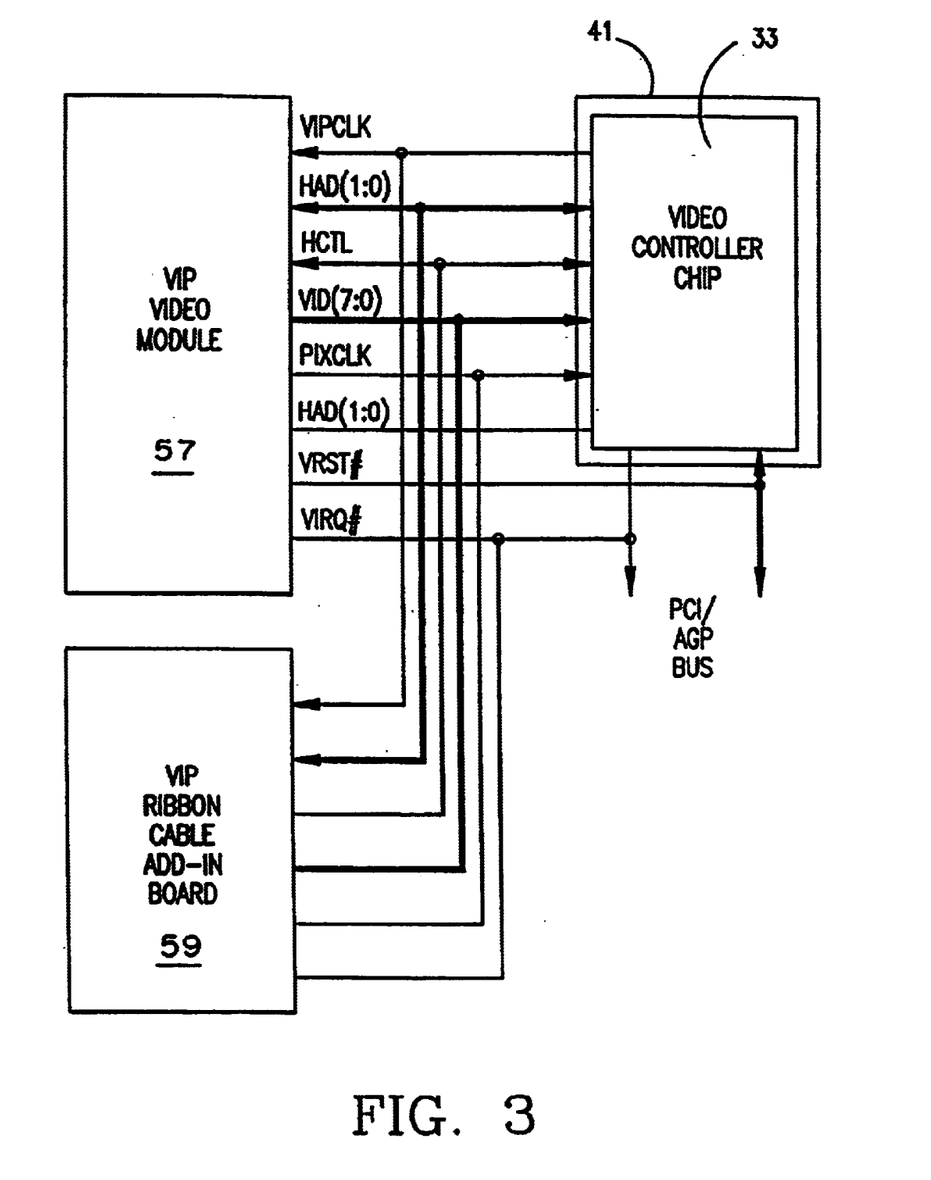

FIG. 3 illustrates the connection of the plug-in video controller chip socket 41 with a VESA VIP compliant video input module 5 or the terminals of an add-in VIP compliant board 59 which can be used in conjunction with circuit board 11. The necessary signal paths to allow the socket 41 to be used with a VIP module or add-in board are illustrated. The socket 41 terminal signal designations which provide for this connection are contained in Tables I and III above.

While the foregoing describes a preferred embodiment of the invention, many modifications can be made without departing from its spirit or scope. Accordingly, the invention is not limited by the foregoing description, but is only limited by the scope of the claims which are appended hereto.

I claim:

1. A circuit board for a computer system comprising:
a wiring board having electronic components mounted thereon which are electronically interconnected and which cooperate to form at least a part of a computer system, said electronic components comprising a microprocessor, memory circuits, input/output ports, and a bus and circuit structure which form an accelerated graphics, port (AGP) circuit architecture;
at least one video output terminal;
a video controller integrated circuit socket mounted on said wiring board, said socket being adapted to receive a single-chip plug-in video controller integrated circuit having embedded video memory, said socket having terminals for supplying signals to and receiving signals from a single-chip plug-in AGP compliant video controller integrated circuit, said terminals including power supply terminals for separately supplying power from said wiring board to different electronic circuit portions of a single-chip plug-in AGP compliant video controller integrate circuit;
said socket being electrically interconnected on said board to allow exchange of information between a single-chip plug-in video controller mounted therein and one or more of said electronic components and said video output terminal.

2. A circuit board as in claim 1, wherein said at least one video output terminal includes terminals for supplying an RBG video signal to an external device.

3. A circuit board as in claim 1, wherein said at least one video output terminal includes terminals for supplying an S-video video signal to an external device.

4. A circuit board as in claim 1, wherein said at least one video output terminal include terminals for supplying a composite video signal to an external device.

5. A circuit board as in claim 1, wherein said socket is electrically connected to terminals on said wiring board for receiving input video signals.

6. A circuit board as in claim 5, wherein said input video signals are in digital format.

7. A circuit board as in claim 5, wherein said input video signals are in analog form.

8. A circuit board as in claim 1, further comprising a single-chip video controller having embedded video memory mounted in said socket.

9. A circuit board as in claim 8, wherein said single-chip video controller is an AGP compliant video controller.

10. A circuit board as in claim 9, wherein said single-chip video controller contains circuitry for processing an input video signal.

11. A circuit board as in claim 10, wherein said input video signal is in a digital format.

12. A circuit board as in claim 10, wherein said input video signal is in an analog format.

13. A circuit board as in claim 10, wherein said socket terminals are connected to AGP signals paths provided on said wiring board.

14. A circuit board as in claim 5, wherein said terminals on said board for receiving video input signals are adapted to receive video input signals compliant with the VESA video interface port (VIP) standard.

15. A circuit board as in claim 3 or 4 wherein said video signal is in an NTSC format.

16. A circuit board as in claim 3 or 4 wherein said video signal is in a PAL format.

17. A circuit board as in claim 1, wherein said socket includes a mechanism to facilitate removal of a single-chip video controller from said socket.

18. A circuit board as in claim 17, wherein said removal mechanism includes a manually operable lever.

19. A circuit board as in claim 1, wherein said power supply terminals include terminals for providing power to video memory circuits embedded in an AGP compliant single-chip video controller.

20. A circuit board as in claim 1, further comprising RGB, S-video and composite video output terminals and wherein said socket includes respective sets of terminals for providing RGB, S-video and composite video signals respectively to said video output terminals.

21. A circuit board as in claim 13, wherein said terminals on said board include terminals for receiving video input signals which are wired to a connector for connection to an external device which supplies VIP compliant video input signals to said circuit board.

22. A computer system comprising:
    a circuit board having electronic components mounted thereon which are electronically interconnected and which cooperate to form a part of a computer system, said electronic components including at least a microprocessor, memory circuits, input/output ports, and a bus and circuit structure for interconnecting said electronic components, said microprocessor, memory circuits, input/output ports, and bus and circuit structure forming an accelerated graphic port (AGP) circuit architecture;
    at least one vide output terminal;
    a video controller integrated circuit socket mounted on said circuit board, said socket being adapted to receive a single-chip plug-in video controller integrated circuit having embedded memory, said socket having terminals for supplying signals to and receiving signals from a single-chip plug-in AGP compliant video controller integrated circuit, said terminals including power supply terminals for separately supplying power from said wiring board to different electronic circuit portions of a single-chip plug-in AGP compliant video controller integrate circuit;
    said socket being electrically interconnected on said board to allow exchange of information between a single-chip plug-in video controller mounted therein and one or more of electronic components and said video output terminal.

23. A computer system as in claim 22 wherein said at least one video output terminal includes terminals for supplying an RGB video signal to an external device.

24. A computer system as in claim 22 wherein said at least one video output terminal includes terminals for supplying an S-video video signal to an external device.

25. A computer system as in claim 22 wherein said at least one video output terminal include terminals for supplying a composite video signal to an external device.

26. A computer system as in claim 22 wherein said socket is electrically connected to terminals on said circuit board for receiving an input video signal.

27. A computer system as in claim 26 wherein said input video signal is in a digital format.

28. A computer system as in claim 26 wherein said input video signal is in an analog format.

29. A computer system as in claim 22 further comprising a single-chip video controller having embedded video memory mounted in said socket.

30. A computer system as in claim 26 further comprising a single-chip video controller having embedded video memory mounted in said socket.

31. A computer system as in claim 29 or 30, wherein said single-chip video controller is an AGP compliant video controller.

32. A computer system as in claim 31, wherein said single-chip video controller contains circuitry for processing an input video signal.

33. A computer system as in claim 32, wherein said input video signal is in a digital signal format.

34. A computer system as in claim 32, wherein said input video signal is in an analog format.

35. A computer system as in claim 27, wherein said socket terminals are connected to AGP signal paths provided on said circuit board.

36. A computer system as in claim 26, wherein said terminals on said board for receiving a video input signal are adapted to receive video input signals compliant with the VESA video interface port (VIP) standard.

37. A computer system as in claim 36, wherein said terminals on said board for receiving video input signals are wired to a connector for connection to an external device which supplies VIP compliant video input signals to said circuit board.

38. A computer system as in claim 24 or 25 wherein said video signal is in an NTSC format.

39. A computer system as in claim 24 or 25, wherein said video signal is in a PAL format.

40. A computer system as in claim 22, wherein said socket includes a mechanism to facilitate removal of a single-chip video controller from said socket.

41. A computer system as in claim 40, wherein said removal mechanism includes a manually operable lever.

42. A computer system as in claim 22, wherein said power supply terminals include terminals for providing power to memory circuits embedded in an AGP compliant single-chip video controller.

43. A computer system as in claim 22, further comprising RGB, S-video and video composite video output terminals and wherein said socket includes respective sets of terminals for providing RGB, S-video and composite video signals respectively to said video output terminals.

44. A socket for mounting a single-chip plug-in video controller having embedded video memory to a circuit board comprising:
    a socket body;
    a plurality of lead receiving terminals in said body for receiving a plurality of leads of a single-chip video controller having embedded video memory;
    a plurality of mounting leads respectively electrically connected to said receiving terminals, said mounting leads extending from said body and being adapted to be mounted on a circuit board and interconnected with the electrical wiring thereon;
    said lead receiving terminals and mounting leads being sufficient in design and number to carry accelerated graphics port (AGP) compliant signals to and from the circuit board, said receiving terminals and mounting leads including terminals and mountings leads for separately supplying power from said circuit board to different electronic circuit portions of an AGP compliant single-chip video controller having embedded video memory.

45. A socket as in claim 44, wherein said lead receiving terminals and mounting leads include terminals and mounting leads for passing video input signals from electrical wiring on a circuit board to a single-chip video controller.

46. A socket as in claim 44, wherein said lead receiving terminals and mounting leads include terminals and mounting leads for passing an RGB video signal from a single-chip video controller to electrical wiring on a circuit board.

47. A socket as in claim 44, wherein said lead receiving terminals and mounting leads include terminals and mounting leads for passing a composite video signal from a single-chip video controller to electrical wiring on a circuit board.

48. A socket as in claim 44, wherein said lead receiving terminals and mounting leads include terminals and mounting leads for passing an S-video signal from a single-chip video controller to electrical wiring on a circuit board.

49. A socket as in claim 44, wherein said power supplying terminals and leads include terminals and leads for separately providing power to video memory circuits embedded in an AGP compliant single-chip-video controller.

50. A socket as in claim 44, wherein said receiving terminals and mounting leads include respective terminals and leads for providing RGB, S-video and composite video signals to a circuit board.

51. A socket as in claim 45, wherein said lead receiving terminals and mounting leads include terminals and mounting leads for passing VIP compliant video input signals from a circuit board to a single-chip video controller.

52. A socket as in claim 49 further comprising a mechanism to facilitate removal of a single-chip video controller from said socket.

53. A socket as in claim 52, wherein said removal mechanism includes a manually operable lever.

54. A circuit board for a computer system comprising:

a wiring board having electronic components mounted thereon which are electronically interconnected and which cooperate to form at least a part of a computer system, said electronic components comprising a microprocessor, memory circuits, input/output ports, and a bus and circuit structure which form an accelerated graphics port (AGP) circuit architecture;

at least one video output terminal;

a video controller integrated circuit socket mounted on said wiring board, said socket being adapted to receive a single-chip plug-in video controller integrated circuit having embedded video memory, said socket having terminals for supplying signals to and receiving signals from a single-chip plug-in AGP compliant video controller integrated circuit, said terminals including power supply terminals for separately supplying power from said wiring board to different electronic circuit portions of a single-chip plug-in AGP compliant video controller integrated circuit;

said socket being electrically interconnected on said board to allow exchange of information between a single-chip plug-in video controller mounted therein and one or more of said electronic components and said video output terminal.

55. A computer system comprising:

a circuit board having electronic components mounted thereon which are electronically interconnected and which cooperate to form a part of a computer system, said electronic components including at least a microprocessor, memory circuits, input/output ports, and a bus and circuit structure for interconnecting said electronic components, said microprocessor, memory circuits, input/output ports, and bus and circuit structure forming an accelerated graphics port (AGP) circuit architecture;

at least one video output terminal;

a video controller integrated circuit socket mounted on said circuit board, said socket being adapted to receive a single-chip plug-in video controller integrated circuit having embedded memory, said socket having terminals for supplying signals to and receiving signals from a single-chip plug-in AGP compliant video controller integrated circuit;

said socket being electrically interconnected on said board to allow exchange of information between a single-chip plug-in video controller mounted therein and one or more of electronic components and said video output terminal.

56. A socket for mounting a single-chip plug-in video controller having embedded video memory to a circuit board comprising:

a socket body;

a plurality of lead receiving terminals in said body for receiving a plurality of leads of a single-chip video controller having embedded video memory;

a plurality of mounting leads respectively electrically connected to said receiving terminals, said mounting leads extending from said body and being adapted to be mounted on a circuit board and interconnected with the electrical wiring thereon;

said lead receiving terminals and mounting leads being sufficient in design and number to carry accelerated graphics port (AGP) compliant signals to and from the circuit board.

* * * * *

UNITED STATES PATENT AND TRADEMARK OFFICE
CERTIFICATE OF CORRECTION

PATENT NO. : 6,789,146 B1
DATED : September 7, 2004
INVENTOR(S) : Paul Dlugosch

It is certified that error appears in the above-identified patent and that said Letters Patent is hereby corrected as shown below:

Column 9,
Line 60, "5" should read -- 57 --.

Column 10,
Line 25, "integrate" should read -- integrated --.
Line 38, "include" should read -- includes --.

Column 11,
Line 43, "integrate" should read -- integrated --.

Signed and Sealed this

Sixteenth Day of November, 2004

JON W. DUDAS
*Director of the United States Patent and Trademark Office*